(12) United States Patent
Andriessen

(10) Patent No.: US 7,118,836 B2
(45) Date of Patent: Oct. 10, 2006

(54) PROCESS FOR PREPARING A SUBSTANTIALLY TRANSPARENT CONDUCTIVE LAYER CONFIGURATION

(75) Inventor: Hieronymus Andriessen, Beerse (BE)

(73) Assignee: Agfa Gevaert, Mortsel (BE)

( * ) Notice: Subject to any disclaimer, the term of this patent is extended or adjusted under 35 U.S.C. 154(b) by 371 days.

(21) Appl. No.: 10/644,043

(22) Filed: Aug. 19, 2003

(65) Prior Publication Data
US 2004/0149962 A1 Aug. 5, 2004

Related U.S. Application Data

(60) Provisional application No. 60/418,637, filed on Oct. 15, 2002.

(30) Foreign Application Priority Data
Aug. 22, 2002 (WO) ...................... PCT/EP02/09427

(51) Int. Cl.
G03C 1/04 (2006.01)
G03C 8/28 (2006.01)
G03C 8/32 (2006.01)
G03C 5/26 (2006.01)
H01C 13/00 (2006.01)

(52) U.S. Cl. .................. 430/18; 430/232; 430/247; 430/248; 430/311; 430/319; 430/444; 430/527; 430/530; 252/501.1; 252/512; 252/514; 252/519.34

(58) Field of Classification Search ............... 430/18, 430/232, 247, 248, 311, 319, 444, 527, 530; 252/501.1, 512, 514, 519.34
See application file for complete search history.

(56) References Cited

U.S. PATENT DOCUMENTS
3,664,837 A 5/1972 Stanley
4,959,178 A 9/1990 Frentzel et al.
(Continued)

FOREIGN PATENT DOCUMENTS
DE 1 938 373 2/1971
DE 196 27 071 A1 1/1998
EP 0 429 313 A1 5/1991
EP 0 510 541 B1 10/1992
(Continued)

OTHER PUBLICATIONS
International Search Report (PCT/EP02/09427) May 23, 2003.

Primary Examiner—Richard L. Schilling
(74) Attorney, Agent, or Firm—Leydig, Voit & Mayer, Ltd

(57) ABSTRACT

A substantially transparent conductive layer on a support, the layer comprising an intrinsically conductive polymer e.g. containing an intrinsically conductive polymer optionally containing structural units represented by formula (I):

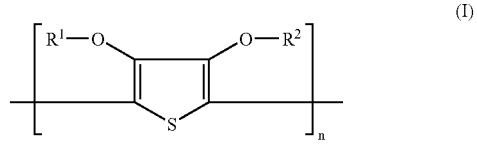

Figure 1:
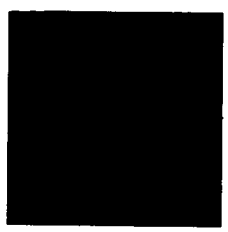
Figure 1:
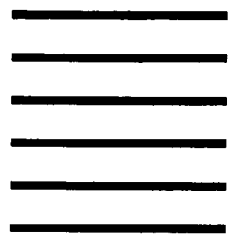
Figure 1:
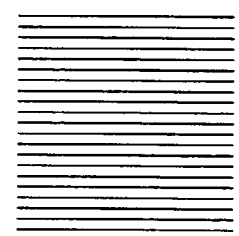
Figure 1:
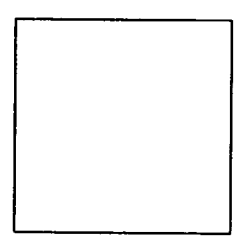

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group; and a conductive metal non-uniformly distributed therein and forming of itself a conductive entity; a process for preparing the transparently conductive layer; and light emitting diodes, photovoltaic devices, transistors and electroluminescent devices comprising the above-described conductive layer.

49 Claims, 1 Drawing Sheet

| U.S. PATENT DOCUMENTS | | | FOREIGN PATENT DOCUMENTS | | |
|---|---|---|---|---|---|
| 5,221,786 A | 6/1993 | Destryker et al. | JP | 3009383 | 1/1991 |
| 5,447,824 A | 9/1995 | Mutsaers et al. | JP | 03022366 | 1/1991 |
| 5,919,402 A | 7/1999 | Murphy et al. | JP | 2000122331 | 4/2000 |
| 5,973,050 A | 10/1999 | Johnson et al. | JP | 2001291990 | 10/2001 |
| 6,015,509 A | 1/2000 | Angelopoulos et al. | WO | WO 98/54767 A1 | 12/1998 |

PROCESS FOR PREPARING A SUBSTANTIALLY TRANSPARENT CONDUCTIVE LAYER CONFIGURATION

This application claims the benefit of U.S. Provisional Application No. 60/418,637 filed Oct. 15, 2002, which is incorporated by reference. In addition, this application claims the benefit of International Application No. PCT/EP 02/09427 filed Aug. 22, 2002, which is also incorporated by reference.

FIELD OF THE INVENTION

The present invention relates to a single layer composite substantially transparent conductive layer.

BACKGROUND OF THE INVENTION

In many applications there is a requirement for inexpensive transparent conducting layers, but a busbar will be also required for some of the (large area) applications. Highly conductive (non-transparent) patterns can be made by screen-printing conducting pastes such as silver or carbon black pastes. Vacuum evaporation of metals through shadow masks is another method. Yet another method makes use of homogeneous conductive metallized surfaces which can be patterned by use of photoresist technology in combination with a metal etching agent. Photographic films can, under certain conditions, be used for making electrically conductive silver "images".

U.S. Pat. No. 3,664,837 describes the use of light sensitive evaporated silver halide film which upon exposure and after development results in conductive images. DE 1,938,373 describes a photographic method for producing conducting paths, resistances and capacitors for microcircuits starting from coated silver halide emulsions. U.S. Pat. No. 3,600,185 describes the production of electrically conductive patterns by means of diffusion transfer techniques.

Combinations of a transparent polymer-based conductor and a high conductive (non-transparent) pattern are described in some publications. DE-A 196 27 071 discloses an electroluminescent configuration, which contains hole and/or electron injecting layers, wherein the polymeric organic conductor is selected from the group of polyfurans, polypyrroles, polyanilines, polythiophenes and polypyridines. DE-A 196 27 071 also discloses the use of poly(3,4-ethylenedioxythiophene) as a charge-injection layer on transparent metallic electrodes such as ITO (indium-tin oxide) and that the following materials are suitable as transparent and conductive materials: a) metal oxides e.g. ITO, tin oxide etc.; b) semi-transparent metal films e.g. Au, Pt, Ag, Cu etc. The latter being applied by vacuum techniques.

EP-A 510 541 discloses an organic electroluminescent device having an anode, an organic hole injection transport layer, an organic luminescent layer and a cathode formed sequentially in this order, wherein the organic hole injection transport layer contains a metal complex and/or a metal salt of an aromatic carboxylic acid. EP-A 510 541 further discloses that the conductive layers used in such devices may have a multi-layer structure by depositing different types of conductive materials selected from a metal, e.g. Al, Au, Ag, Ni, Pd or Te, a metal oxide, carbon black or a conductive resin such as poly(3-methylthiophene), but no specific combinations are exemplified.

U.S. Pat. No. 5,447,824 discloses a method of manufacturing a pattern of an electrically conductive polymer on a substrate surface, said method comprising: a) forming a liquid layer on a surface of said substrate from a solution containing a material capable of forming said electrically conductive polymer upon being heated, e.g. 3,4-ethylenedioxythiophene, an oxidizing agent and a base, b) exposing said liquid layer to patterned radiation, and c) heating said layer thereby forming a pattern of an electrically conductive polymer, said conductive polymer being formed in unexposed areas and a non-conductive polymer being formed in the exposed areas of the layer. The galvanic provision of the conductive polymer pattern with a metal layer, e.g. silver, copper, nickel or chromium, is also disclosed in U.S. Pat. No. 5,447,824.

U.S. Pat. No. 5,973,050 discloses a conductive composition of matter comprising a dispersion of nanophase metal particles in an intrinsically conducting polymer with nanophase metal particles being preferably selected from the group consisting of silver, copper, platinum, palladium, aluminum, chromium, iron, antimony, tin, tantalum, gold, similar metals and mixtures thereof, and the intrinsically being preferably a conjugated polymer e.g. polythiophene, polyaniline, polypyrrole, polyacetylene, their substituted derivatives and similar polymers.

U.S. Pat. No. 5,919,402 discloses a composition, comprising: (a) a three dimensional matrix formed by photopolymerizing an electronically conducting polymer; and (b) silver grains substantially uniformly distributed throughout the matrix and having a diameter less than about 5 μm.

U.S. Pat. No. 6,015,509 discloses a composition comprising a thermoset or thermoplastic polymeric matrix, and a conductive filler component, where said filler component comprises electrically conductive particles and at least one conducting polymer selected from the group consisting of substituted and unsubstituted polyparaphenylenevinylenes, substituted and unsubstituted polyanilines, substituted and unsubstituted polyazines, substituted and unsubstituted polythiophenes, substituted and unsubstituted polyparaphenylenes, substituted and unsubstituted poly-p-phenylene sulfides, substituted and unsubstituted polyfuranes, substituted and unsubstituted polypyrroles, substituted and unsubstituted polyselenophenes, substituted and unsubstituted polyacetylenes, mixtures thereof, and copolymers thereof, being obtained by separately admixing the conducting polymer and the conductive is particles with the polymeric matrix.

WO 98/54767 discloses a conductive layer system, particularly for a transparent or semi-transparent electrode or electroluminescent configuration, comprising at least two layers, characterized in that the first layer contains an organic or organometallic electrically conductive polymer, which is transparent or semi-transparent in the visible range of the electromagnetic spectrum, e.g. a polymer selected from the group consisting of polythiophene, polypyrrole, polyaniline, polyacetylene or their optionally substituted derivatives and the second layer contains at least one electrically conductive inorganic compound or a metal or an appropriately doped semi-metal e.g. a material selected from the group consisting of Cu, Ag, Au, Pt, Pd, Fe, Cr, Sn, Al or their alloys or conductive carbon. In a preferred embodiment the second layer is a conductive pattern formed by an open grid structure, preferably with a 5–500 μm grid so that it cannot be perceived by the human eye. Invention example 2 discloses a poly(3,4-ethylenedioxythiophene) [PEDOT]/poly(styrene sulphonate) [PSS] layer with a surface resistivity of 1500 Ω/square to which conducting tracks of Leitsilber™ (a silver particle dispersion) ca. 2 mm wide had been applied by a printing technique.

The layer configuration disclosed in Example 2 of WO 98/54767 has the disadvantages of the grid of Leitsilber™ requiring a thickness of 5 to 10 μm to realize layers with a surface resistance of 0.5 to 1 Ω/square, which means that the surface of the configuration will have a certain roughness which will limit its applications, making it difficult to apply a thin, e.g. 100 nm, functional layer. Furthermore, an aqueous PEDOT/PSS dispersion would not wet such a Leitsilber™ grid and hence a usable multilayer conductive configuration would not result.

Moreover, with an intrinsically conductive polymer layer or a metal grid outermost wetting problems arise as regards coating of thin functional layers. Furthermore, for devices requiring very thin functional layers such as transistors, the thickness of a multilayer electrode and even slight deviations from flatness are disadvantageous in their production.

ASPECTS OF THE INVENTION

It is therefore an aspect of the present invention to provide a conductive electrode with similar properties, but thinner than multilayer electrodes comprising a conductive polymer layer and a conductive metal layer with an outermost layer with improved flatness.

It is a further aspect of the present invention to provide a process for preparing a conductive electrode with similar properties, but thinner than multilayer electrodes comprising a conductive polymer layer and a conductive metal layer with an outermost layer with improved flatness.

It is also an aspect of the present invention to prevent ion migration from the conductive electrode.

Further aspects and advantages of the invention will become apparent from the description hereinafter.

SUMMARY OF THE INVENTION

It has been surprisingly found that a thin substantially transparent conductive layer with high conductivity and with an outermost surface with improved flatness can be realized in a layer containing an intrinsically conductive polymer, e.g. PEDOT/PSS, and a conductive metal, e.g. silver, non-uniformly distributed therein to which functional layers can be readily applied.

Upon applying a potential between the conductive layer, according to the present invention, as cathode and a counter-electrode as cathode under conditions of high relative humidity metal ions present at the anode, there always being an equilibrium between metal ions and metal atoms, diffuse under the applied potential to the cathode, where they are deposited at metal atoms which stack forming dendritic metal which grow towards the anode. This results long term in short circuiting of the electrodes.

In the case of conductive layers containing silver ions migrate and silver dendrites are formed. The use of benzotriazole as a silver electrode-stabilizer is disclosed in U.S. Pat. Nos. 4,821,148 and 6,174,606 and Evenpoel et al. in 1970 disclosed the use of thiourea in Metallurgie X, volume 4, page 132, and Ambland et al. in 1978 disclosed the use of tartaric acid in Surface Technology, volume 6, pages 409–423. However, these remedies were unsuccessful with the conductive layer of the present invention. Surprisingly, it has been found that particular phenyl-mercaptotetrazole compounds are capable of substantially preventing the formation of silver dendrites.

Aspects of the present invention are realized by a substantially transparent conductive layer on a support, the layer comprising an intrinsically conductive polymer and a conductive metal non-uniformly distributed therein and forming of itself a conductive entity.

Aspects of the present invention are also realized by a process for preparing a substantially transparent conductive layer on a support, the layer comprising an intrinsically conductive polymer and a conductive metal non-uniformly distributed therein and forming of itself a conductive entity, comprising the step of: preparing the non-uniformly distributed conductive metal by a photographic process.

Aspects of the present invention are also realized by a light emitting diode comprising the above-described conductive layer or a second light emitting diode produced according to the above-described process.

Aspects of the present invention are also realized by a photovoltaic device comprising the above-described conductive layer or a second photovoltaic device produced according to the above-described process.

Aspects of the present invention are also realized by a transistor comprising the above-described conductive layer or a second transistor produced according to the above-described process.

Aspects of the present invention are also realized by an electroluminescent device comprising the above-described conductive layer or a second electroluminescent device produced according to the above-described process.

Preferred embodiments are disclosed in the dependent claims.

DETAILED DESCRIPTION OF THE INVENTION

FIG. 1 shows four silver patterns, pattern (a) representing a continuous silver layer 3×3 $cm^2$ in area, pattern (b) representing a regular strip pattern, the parallel strips being 10 mm apart and having a width of 1 mm; pattern (c) representing a regular strip pattern, the parallel strips being 5 mm apart and having a width of 150 μm; and pattern (d) representing no silver development.

DEFINITIONS

The term alkyl means all variants possible for each number of carbon atoms in the alkyl group i.e. for three carbon atoms: n-propyl and isopropyl; for four carbon atoms: n-butyl, isobutyl and tertiary-butyl; for five carbon atoms: n-pentyl, 1,1-dimethylpropyl, 2,2-dimethylpropyl and 2-methyl-butyl etc.

The term aqueous for the purposes of the present invention means containing at least 60% by volume of water, preferably at least 80% by volume of water, and optionally containing water-miscible organic solvents such as alcohols e.g. methanol, ethanol, 2-propanol, butanol, iso-amyl alcohol, octanol, cetyl alcohol etc.; glycols e.g. ethylene glycol; glycerine; N-methylpyrrolidone; methoxypropanol; and ketones e.g. 2-propanone and 2-butanone etc.

The term "support" means a "self-supporting material" so as to distinguish it from a "layer" which may be coated on a support, but which is itself not self-supporting. It also includes any treatment necessary for, or layer applied to aid, adhesion to the support.

The term continuous layer refers to a layer in a single plane covering the whole area of the support and not necessarily in direct contact with the support.

The term non-continuous layer refers to a layer in a single plane not covering the whole area of the support and not necessarily in direct contact with the support.

The term coating in used as a generic term including all means of applying a layer including all techniques for producing continuous layers, such as curtain coating and doctor-blade coating and all techniques for producing non-continuous layers such as screen printing, ink jet printing, flexographic printing, and techniques for producing continuous layers The term intrinsically conductive polymer means organic polymers which have (poly)-conjugated π-electron systems (e.g. double bonds, aromatic or heteroaromatic rings or triple bonds) and whose conductive properties are not influenced by environmental factors such as relative humidity.

The term "conductive" is related to the electric resistance of the material. The electric resistance of a layer is generally expressed in terms of surface resistance $R_s$ (often specified as Ω/square). Alternatively, the conductivity may be expressed in terms of volume resistivity $R_v=R_x \cdot d$, wherein d is the thickness of the layer, volume conductivity $k_v=1/R_v$ [unit: S(iemens)/cm] or surface conductance $k_s=1/R_s$ [unit: S(iemens).square].

The term photographic refers to any photochemical process particularly those based on silver halide processes.

The term silver salt diffusion transfer process refers to a process developed independently by A. Rott [GB 614,155 and Sci. Photogr., (2)13, 151 (1942)]and E. Weyde [DE 973,769] and described by G. I. P. Levenson in Chapter 16 of "The Theory of the Photographic Process Fourth Edition", edited by T. H. James, pages 466 to 480, Eastman Kodak Company, Rochester (1977).

The term substantially transparent means that the integral transmission of visible light is above 50% of the incident light normal to the conductive layer of the present invention i.e. the layer had an overall optical density of less than 0.30, although local transmission of visible light though the lines of the silver pattern may be well below 10% of the incident light normal to the conductive layer of the present invention i.e. well above an optical density of 1.0.

The abbreviation PEDOT represents poly(3,4-ethylenedioxythiophene).

The abbreviation PSS represents poly(styrene sulphonic acid) or poly(styrenesulphonate).

Conductive Layer

Aspects of the present invention are realized by a substantially transparent conductive layer on a support, the layer comprising an intrinsically conductive polymer and a conductive metal non-uniformly distributed therein and forming of itself a conductive entity. It should be emphasised that in the conductive layer, according to the present invention, the conductive metal is non-uniformly distributed therein, unlike the conductive composition disclosed in U.S. Pat. No. 5,973,050, the composition disclosed in U.S. Pat. No. 5,919,402 and any layer prepared from a dispersion of the intrinsically conductive polymer-coated metal particles disclosed in U.S. Pat. No. 6,015,509.

According to a first embodiment of the conductive layer, according to the present invention, the conductive layer has a surface resistance of less than 200 Ω/square.

According to a second embodiment of the conductive layer, according to the present invention, the conductive layer has a surface resistance of less than 100 Ω/square.

According to a third embodiment of the conductive layer, according to the present invention, the conductive layer has a surface resistance of less than 50 Ω/square.

According to a fourth embodiment of the conductive layer, according to the present invention, the conductive layer has an optical density of less than 0.50.

According to a fifth embodiment of the conductive layer, according to the present invention, the conductive layer has an optical density of less than 0.30.

According to a sixth embodiment of the conductive layer, according to the present invention, the conductive metal is exclusive of a nanophase metal.

According to a seventh embodiment of the conductive layer, according to the present invention, the conductive layer is exclusive of an electron acceptor such as silver nitrate, silver perchlorate and silver nitrite.

According to an eighth embodiment of the conductive layer, according to the present invention, the conductive metal is silver.

Intrinsically Conductive Polymer

The intrinsically conductive polymers used in the present invention can be any intrinsically conductive polymer known in the art e.g. polyacetylene, polypyrrole, polyaniline, polythiophene, etc. Details about suitable intrinsically conductive polymers can be found in textbooks, such as "Advances in Synthetic Metals", ed. P. Bernier, S. Lefrant, and G. Bidan, Elsevier, 1999; "Intrinsically Conducting Polymers: An Emerging Technology", Kluwer (1993); "Conducting Polymer Fundamentals and Applications, A Practical Approach", P. Chandrasekhar, Kluwer, 1999; and "Handbook of Organic Conducting Molecules and Polymers", Ed. Walwa, Vol. 1–4, Marcel Dekker Inc. (1997).

According to a ninth embodiment of the conductive layer process, according to the present invention, the intrinsically conductive polymer contains structural units represented by formula (I):

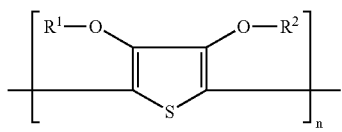

in which, each of $R^1$ and $R^2$ independently represents hydrogen or a $C_{1-4}$ alkyl group or together represent an optionally substituted $C_{1-4}$ alkylene group or a cycloalkylene group.

According to a tenth embodiment of the conductive layer, according to the present invention, the intrinsically conductive polymer is a polymer or copolymer of a 3,4-dialkoxythiophene in which the two alkoxy groups together represent an optionally substituted oxy-alkylene-oxy bridge.

According to an eleventh embodiment of the conductive layer, according to the present invention, the intrinsically conductive polymer is a polymer or copolymer of a 3,4-dialkoxy-thiophenes in which the two alkoxy groups together represent an optionally substituted oxy-alkylene-oxy bridge and is selected from the group consisting of: poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene) and poly(3,4-butylenedioxythiophene) derivatives and copolymers thereof.

According to a twelfth embodiment of the conductive layer, according to the present invention, the intrinsically conductive polymer is a polymer or copolymer of a 3,4-dialkoxy-thiophenes in which the two alkoxy groups together represent an optionally substituted oxy-alkylene-oxy bridge and the substituents for the oxy-alkylene-oxy bridge are alkyl, alkoxy, alkyloxyalkyl, carboxy, alkylsulfonato and carboxy ester groups.

According to a thirteenth embodiment of the conductive layer, according to the present invention, the intrinsically conductive polymer is a polymer or copolymer of a 3,4-dialkoxy-thiophenes in which the two alkoxy groups together represent an optionally substituted oxy-alkylene-oxy bridge and the two alkoxy groups together represent an optionally substituted oxy-alkylene-oxy bridge which is a 1,2-ethylene group, an optionally alkyl-substituted methylene group, an optionally $C_{1-12}$-alkyl- or phenyl-substituted 1,2-ethylene group, a 1,3-propylene group or a 1,2-cyclohexylene group.

Such polymers are disclosed in Handbook of Oligo- and Polythiophenes Edited by D. Fichou, Wiley-VCH, Weinheim (1999); by L. Groenendaal et al. in Advanced Materials, volume 12, pages 481–494 (2000); L. J. Kloeppner et al. in Polymer Preprints, volume 40(2), page 792 (1999); P. Schottland et al. in Synthetic Metals, volume 101, pages 7–8 (1999); and D. M. Welsh et al. in Polymer Preprints, volume 38(2), page 320 (1997).

Organic polymer containing structural units according to formula (I) can be polymerized chemically or electrochemically. Chemical polymerization can be carried out oxidatively or reductively. The oxidation agents used for the oxidative polymerisation of pyrrole, such as described for example in J. Amer. Chem. Soc., vol. 85, pages 454–458 (1963) and J. Polym. Sci. Part A Polymer Chemistry, volume 26, pages 1287–1294 (1988), can be utilized for the oxidative polymerization of thiophenes. According to a seventh embodiment of the present invention, the inexpensive and easily accessible oxidation agents such as iron(III) salts such as $FeCl_3$, the iron(III) salts of organic acids, e.g. $Fe(OTs)_3$, $H_2O_2$, $K_2Cr_2O_7$, alkali and ammonium persulphates, alkali perborates and potassium permanganate are used in the oxidative polymerization.

Theoretically the oxidative polymerization of thiophenes requires 2.25 equivalents of oxidation agent per mole thiophene of formula (I) [see e.g. J. Polymer Science Part A Polymer Chemistry, volume 26, pages 1287–1294 (1988)]. In practice an excess of 0.1 to 2 equivalents of oxidation agent is used per polymerizable unit. The use of persulphates and iron(III) salts has the great technical advantage that they do not act corrosively. Furthermore, in the presence of particular additives oxidative polymerization of the thiophene compounds according to formula (I) proceeds so slowly that the thiophenes and oxidation agent can be brought together as a solution or paste and applied to the substrate to be treated. After application of such solutions or pastes the oxidative polymerization can be accelerated by heating the coated substrate as disclosed in U.S. Pat. No. 6,001,281 and WO 00/14139 herein incorporated by reference.

Reductive polymerization can be performed using the Stille (organotin) or Suzuki (organoboron) routes described in 2002 by Appperloo et al. in Chem. Eur. Journal, volume 8, pages 2384–2396, and as disclosed in 2001 in Tetrahedron Letters, volume 42, pages 155–157 and in 1998 in Macromolecules, volume 31, pages 2047–2056 respectively or with nickel complexes as disclosed in 1999 in Bull. Chem. Soc. Japan, volume 72, page 621 and in 1998 in Advanced Materials, volume 10, pages 93–116.

1-phenyl-5-mercato-tetrazole Compound in Which the Phenyl Group is Substituted With One or More Electron Accepting Groups According to a fourteenth embodiment of the conductive layer, according to the present invention, the conductive layer further contains a silver-ion stabilizer.

According to a fifteenth embodiment of the conductive layer, according to the present invention, the conductive layer further contains a silver-ion stabilizer which is a 1-phenyl-5-mercatotetrazole compound in which the phenyl group is substituted with one or more electron accepting groups.

According to a sixteenth embodiment of the conductive layer, according to the present invention, the conductive layer further contains a silver-ion stabilizer which is a 1-phenyl-5-mercatotetrazole compound in which the phenyl group is substituted with one or more electron accepting groups groups selected from the group consisting of chloride, fluoride, cyano, sulfonyl, nitro, acid amido and acylamino groups.

According to a seventeenth embodiment of the conductive layer, according to the present invention, the conductive layer further contains a silver-ion stabilizer which is selected from the group consisting of: 1-(3',4'-dichlorophenyl)-5-mercapto-tetrazole,

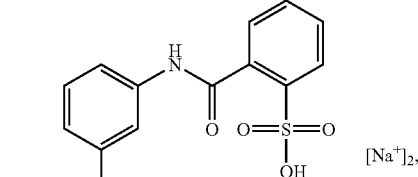 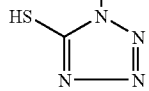

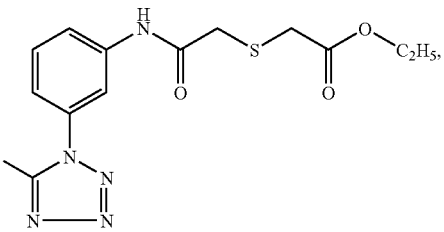

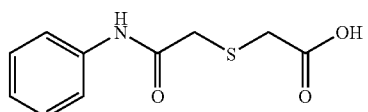

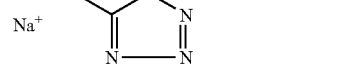

Suitable 1-phenyl-5-mercapto-tetrazole compounds with substituted phenyl groups [PMT], according to the present invention, include:

| | Structural formula | |
|---|---|---|
| PMT01 | 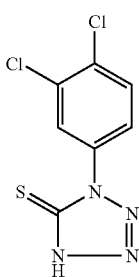 | 1-(3',4'-dichlorophenyl)-5-mercapto-tetrazole |
| PMT02 | 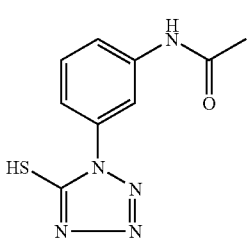 | 1-(3'-acetylamino-phenyl)-5-mercapto-tetrazole |

-continued
Structural formula
PMT03 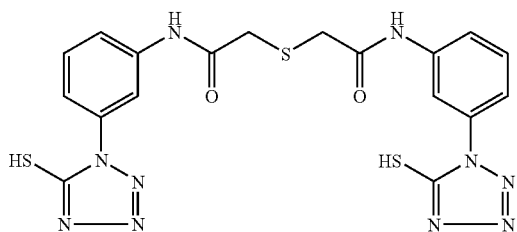
PMT04 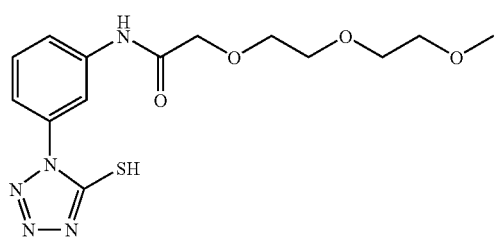
PMT05 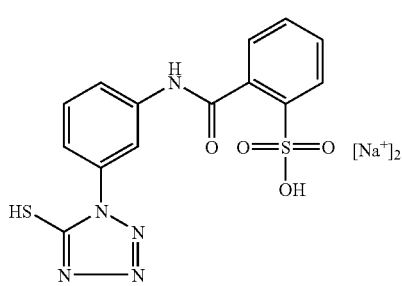
PMT06 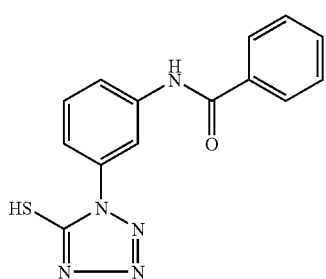  1-(3'-benzoylamino-phenyl)-5-mercapto-tetrazole
PMT07 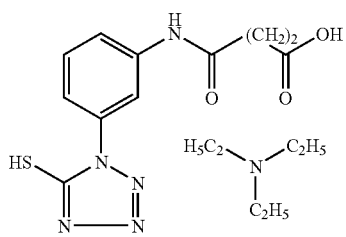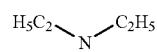
PMT08 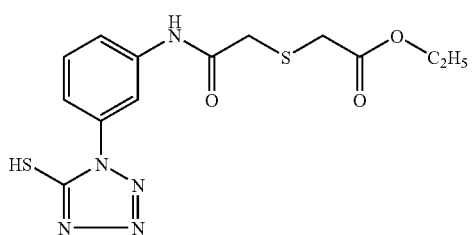

-continued
| Structural formula |
|---|
| PMT09 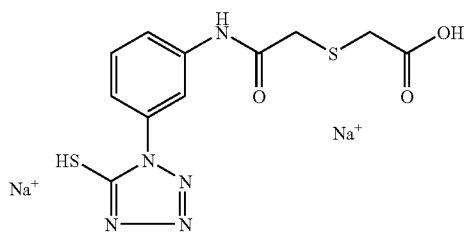 |
| PMT10 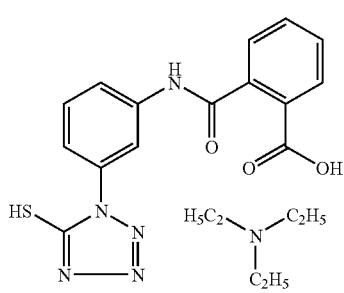 |
| PMT11 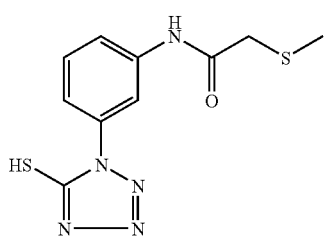 |
| PMT12 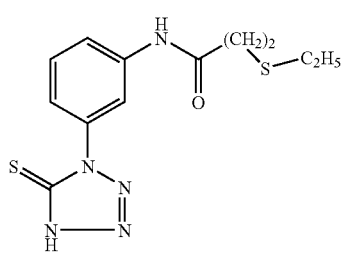 |
| PMT13 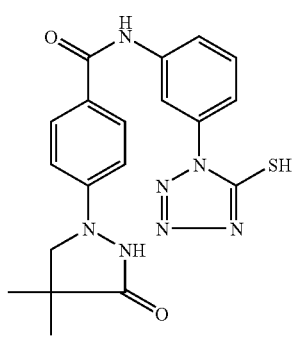 |

-continued

Structural formula

PMT14

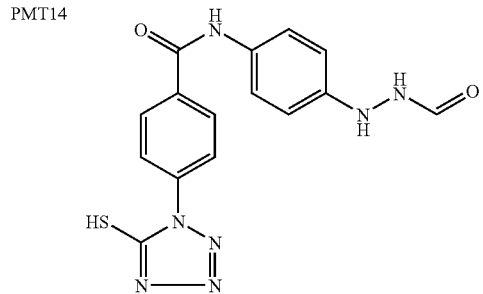

Process for Preparing a Conductive Layer

Aspects of the present invention are also realized by a process for preparing a substantially transparent conductive layer on a support, the layer comprising an intrinsically conductive polymer and a conductive metal non-uniformly distributed therein and forming of itself a conductive entity, comprising the step of: preparing the non-uniformly distributed conductive metal by a photographic process.

According to a first embodiment of the process, according to the present invention, the photographic process comprises the steps of: coating the support with a layer containing the intrinsically conductive polymer and a nucleation agent; producing a non-continuous silver layer in the nucleation layer using silver salt diffusion transfer.

According to a second embodiment of the process, according to the present invention, the photographic process comprises the steps of: coating the support with a layer containing the intrinsically conductive polymer and palladium sulphide e.g. palladium sulphide nanoparticles, as a nucleation agent; producing a non-continuous silver layer in the nucleation layer using silver salt diffusion transfer.

According to a third embodiment of the process, according to the present invention, the photographic process comprises the steps of: coating the support with a layer containing an intrinsically conductive polymer, silver halide and gelatin with a weight ratio of gelatin to silver halide in the range of 0.05 to 0.3, image-wise exposing the layer, and developing the exposed layer to produce the non-uniformly distributed silver.

Surfactants

According to an eighteenth embodiment of the conductive layer, according to the present invention, the conductive layer further contains a surfactant.

According to a nineteenth embodiment of the conductive layer, according to the present invention, the conductive layer further contains a non-ionic surfactant e.g. ethoxylated/fluoroalkyl surfactants, polyfluorcaprylamide-polyglycol surfactants, polyethoxylated silicone surfactants, polysiloxane/polyether surfactants, ammonium salts of perfluoroalkylcarboxylic acids, polyethoxylated surfactants and fluorine-containing surfactants.

Suitable non-ionic surfactants include:

Surfactant no. 01=ZONYL™ FSN, a 40% by weight solution of $F(CF_2CF_2)_{1-9}CH_2CH_2O(CH_2CH_2O)_xH$ in a 50% by weight solution of isopropanol in water where x=0 to about 25, from DuPont;

Surfactant no. 02=ZONYL™ FSN-100: $F(CF_2CF_2)_{1-9}CH_2CH_2O(CH_2CH_2O)_xH$ where x=0 to about 25, from DuPont;

Surfactant no. 03=ZONYL™ FS300, a 40% by weight aqueous solution of a fluorinated surfactant, from DuPont;

Surfactant no. 04=ZONYL™ FSO, a 50% by weight solution of a mixture of ethoxylated non-ionic fluoro-surfactant with the formula: $F(CF_2CF_2)_{1-7}CH_2CH_2O(CH_2CH_2O)_yH$ where y=0 to ca. 15 in a 50% by weight solution of ethylene glycol in water, from DuPont;

Surfactant no. 05=ZONYL™ FSO-100, a mixture of ethoxylated non-ionic fluoro-surfactant from DuPont with the formula: $F(CF_2CF_2)_{1-7}CH_2CH_2O(CH_2CH_2O)_yH$ where y=0 to ca. 15 from DuPont;

Surfactant no. 06=Tegoglide™ 410, a polysiloxane-polymer copolymer surfactant, from Goldschmidt;

Surfactant no. 07=Tegowet™, a polysiloxane-polyester copolymer surfactant, from Goldschmidt;

Surfactant no. 08=FLUORAD™ FC431: $CF_3(CF_2)_7SO_2(C_2H_5)N-CH_2CO-(OCH_2Ch_2)_nOH$ from 3M;

Surfactant no. 09=FLUORAD™ FC126, a mixture of the ammonium salts of perfluorocarboxylic acids, from 3M;

Surfactant no. 10=Polyoxyethylene-10-lauryl ether

Surfactant no. 11=FLUORAD™ FC430, a 98.5% active fluoroaliphatic ester from 3M;

According to a twentieth embodiment of the conductive layer, according to the present invention, the conductive layer further contains an anionic surfactant.

Suitable anionic surfactants include:

Surfactant no. 12=ZONYL™ 7950, a fluorinated surfactant, from DuPont;

Surfactant no. 13=ZONYL™ FSA, 25% by weight solution of $F(CF_2CF_2)_{1-9}CH_2CH_2SCH_2CH_2COOLi$ in a 50% by weight solution of isopropanol in water, from DuPont;

Surfactant no. 14=ZONYL™ FSE, a 14% by weight solution of $[F(CF_2CF_2)_{1-7}CH_2CH_2O]_xP(O)(ONH_4)_y$, where x=1 or 2; y=2 or 1; and x+y=3 in a 70% by weight aqueous ethylene glycol solution, from DuPont;

Surfactant no. 15=ZONYL™ FSJ, a 40% by weight solution of a blend of $F(CF_2CF_2)_{1-7}CH_2CH_2O]_xP(O)(ONH_4)_y$, where x=1 or 2; y=2 or 1; and x+y=3 with a hydrocarbon surfactant in 25% by weight solution of isopropanol in water, from DuPont;

Surfactant no. 16=ZONYL™ FSP, a 35% by weight solution of $[F(CF_2CF_2)_{1-7}CH_2CH_2O]_xP(O)(ONH_4)$ where x=1 or 2; y=2 or 1 and x+y=3 in 69.2% by weight solution of isopropanol in water, from DuPont;

Surfactant no. 17=ZONYL™ UR: [F(CF$_2$CF$_2$)$_{1-7}$CH$_2$CH$_2$O]$_x$P(O)(OH)$_y$, where x=1 or 2; y=2 or 1 and x+y=3, from DuPont;

Surfactant no. 18=ZONYL™ TBS: a 33% by weight solution of F(CF$_2$CF$_2$)$_{3-8}$CH$_2$CH$_2$SO$_3$H in a 4.5% by weight solution of acetic acid in water, from DuPont;

Surfactant no. 19=ammonium salt of perfluoro-octanoic acid from 3M

Binder

According to a twenty-first embodiment of the conductive layer, according to the present invention, the conductive layer is exclusive of a binder.

According to a twenty-second embodiment of the conductive layer, according to the present invention, the conductive layer further contains a binder.

According to a twenty-third embodiment of the conductive layer, according to the present invention, the conductive layer further contains a water-soluble or water-dispersible polymer as a binder. Suitable water-dispersible binders are homopolymers and copolymers of acrylic and methacrylic acid esters and terpolymers of vinylidene chloride, methyl acrylate and itaconic acid.

Crosslinking Agent

According to a twenty-fourth embodiment of the conductive layer, according to the present invention, the conductive layer further contains a cross-linking agent.

Support

According to a twenty-fifth embodiment of the conductive layer, according to the present invention, the support is transparent or translucent.

According to a twenty-sixth embodiment of the conductive layer, according to the present invention, the support is a polymeric film, silicon, a ceramic, an oxide, glass, polymeric film reinforced glass, a glass/plastic laminate, a metal/plastic laminate, optionally treated paper and laminated paper.

According to a twenty-seventh embodiment of the conductive layer, according to the present invention, the support is provided with a subbing layer or other adhesion promoting means to aid adhesion to the substantially transparent conductive layer.

According to a twenty-eighth embodiment of the conductive layer, according to the present invention, the support is a transparent or translucent polymer film.

A transparent or translucent support suitable for use with the electroconductive or antistatic layers, according to the present invention, may be rigid or flexible and consist of a glass, a glass-polymer laminate, a polymer laminate, a thermoplastic polymer or a duroplastic polymer. Examples of thin flexible supports are those made of a cellulose ester, cellulose triacetate, polypropylene, polycarbonate or polyester, with poly(ethylene terephthalate), poly(ethylene naphthalene-1,4-dicarboxylate), polystyrene, polyethersulphone, polycarbonate, polyacrylate, polyamide, polyimides, cellulosetriacetate, polyolefins and poly(vinylchloride), optionally treated by corona discharge or glow discharge or provided with a subbing layer.

Electroluminescent Devices

Aspects of the present invention are also realized by an electroluminescent device comprising the conductive layer, according to the present invention, or a second electroluminescent device produced according to the process, according to the present invention.

Thin film electroluminescent devices (ELDs) are all characterized by one (or more) electroluminescent active layer(s) sandwiched between two electrodes. Optionally a dielectric layer may also be part of the sandwich.

Thin film ELDs can be subdivided into organic and inorganic based ELDs. Organic-based thin film ELDs can be subdivided into low molecular weight organic devices including ologomers (Organic Light Emitting Diodes (OLEDs)) and high molecular weight organic devices (Polymer Light Emitting Diodes (PLEDs). The inorganic ELDs on the other hand can be further subdivided into the High Voltage Alternating Current (HV-AC) ELDs and the Low Voltage Direct Current (LV-DC) ELDs. The LV-DC ELDs include Powder ELDs (DC-PEL Devices or DC-PELDs) and thin film DC-ELDS, hereinafter called Inorganic Light Emitting Diodes (ILEDs).

The basic construction of organic ELDs (PLED and OLED) comprises following layer arrangement: a transparent substrate (glass or flexible plastic), a transparent conductor, e.g. Indium Tin Oxide (ITO), a hole transporting layer, a luminescent layer, and a second electrode, e.g. a Ca, Mg/Ag or Al/Li electrode. For OLEDs the hole transporting layer and the luminescent layer are 10–50 nm thick and applied by vacuum deposition, whereas for PLEDs the hole transporting layer is usually about 40 nm thick and the luminescent layer is usually about 100 nm thick and applied by spin coating or other non-vacuum coating techniques. A direct voltage of 5–10 V is applied between both electrodes and light emission results from holes and electrons being injected from the positive and negative electrodes respectively combining in the luminescent layer thereby producing the energy to excite the luminescent species to emit light.

In OLEDs the hole transporting layer and electroluminescent layer consist of low molecular organic compounds, N,N'-diphenyl-1,1'-biphenyl-4,4'-diamine (TPD) can, for example be used as the hole transporter and aluminium (III) 8-hydroxyquinoline complex (Alq$_3$), polyaromatics (anthracene derivatives, perylene derivatives and stilbene derivatives) and polyhetero-aromatics (oxazoles, oxadiazoles, thiazoles etc.) can be used as electroluminescent compounds.

In PLEDs electroluminescent compounds that can be used are polymers like the non-conjugated polyvinylcarbazole derivatives (PVK) or conjugated polymers like poly(p-phenylene vinylenes) (PPV), polyfluorenes, poly(3-alkylthiophene), poly(p-phenylene ethynylenes) etc.

Low voltage DC PEL Devices generally comprise a transparent substrate, a transparent conductor (ITO), a doped ZnS phosphor layer (20 μm), and a top electrode of evaporated aluminium. The phosphor layer is applied by means of the doctor blade technique or screen printing on an ITO conducting layer. Subsequently an aluminium electrode is applied by evaporation. Upon applying a direct current voltage of several volts (ITO positive), holes start moving towards the aluminium electrode, thereby creating an insulating region (about 1 μm in thickness) next to the ITO layer within one minute or so. This results in a current drop, which is associated with the onset of light emission. This process has been called the forming process. In the thin high resistive phosphor layer thereby formed, high electric fields occur and electroluminescence is already possible at low voltages (typically between 10 and 30 V).

In hybrid LEDs, inorganic emitting so-called quantum dots are used in combination with organic polymers with charge transporting properties and in some cases also emitting properties. Hybrid LEDs with CdSe nano particles have been reported by Colvin et al. [see Nature, volume 370, pages 354–357, (1994)], Dabbousi et al. [see Applied Physics Letters, volume 66, pages 1316–1318 (1995), and Gao et al. [see J. Phys. Chem. B, volume 102, pages 4096–4103 (1998)], herein incorporated by reference.

Light-emitting devices with ZnS:Cu nano-crystals and a non-semiconducting polymer have been reported by Huang et al. [see Appl. Phys. Lett., volume 70, pages 2335–2337 (1997)] and Que et al. [see Applied Physics Letters, volume 73, pages 2727–2729 (1998)], herein incorporated by reference, with turn on voltages below 5 V.

According to a first embodiment of the electroluminescent devices, according to the present invention, the electroluminescent device is a light emitting diode.

According to a second embodiment of the electroluminescent devices, according to the present invention, the electroluminescent device further comprises a layer of an electroluminescent phosphor.

According to a third embodiment of the electroluminescent devices, according to the present invention, the electroluminescent device comprises a layer of an electroluminescent phosphor, wherein the electroluminescent phosphor belongs to the class of II–VI semiconductors e.g. ZnS, or is a combination of group II elements with oxidic anions, the most common being silicates, phosphates, carbonates, germanates, stannates, borates, vanadates, tungstates and oxysulphates. Typical dopants are metals and all the rare earths e.g. Cu, Ag, Mn, Eu, Sm, Tb and Ce.

According to a fourth embodiment of the electroluminescent devices, according to the present invention, the electroluminescent device comprises a layer of an electroluminescent phosphor, wherein the electroluminescent phosphor is encapsulated with a transparent barrier layer against moisture e.g. $Al_2O_3$ and AlN. Such phosphors are available from Sylvania, Shinetsu polymer KK, Durel, Acheson and Toshiba. An example of coatings with such phosphors is 72X, available from Sylvania/GTE, and coatings disclosed in U.S. Pat. No. 4,855,189.

According to a fifth embodiment of the electroluminescent devices, according to the present invention, the electroluminescent device further comprises a layer of an electroluminescent phosphor, wherein the electroluminescent phosphor is ZnS doped with manganese, copper or terbium, or $CaGa_2S_4$ doped with cerium e.g. the electroluminescent phosphor pastes supplied by DuPont: LUXPRINT™ type 7138J, a white phosphor; LUXPRINT™ type 7151J, a green-blue phosphor; and LUXPRINT™ type 7174J, a yellow-green phosphor; and ELECTRODAG™ EL-035A supplied by Acheson.

According to a sixth embodiment of the electroluminescent devices, according to the present invention, the electroluminescent device further comprises a layer of an electroluminescent phosphor, wherein the electroluminescent phosphor is a zinc sulphide phosphor doped with manganese and encapsulated with AlN.

According to a seventh embodiment of the electroluminescent devices, according to the present invention, the electroluminescent device further comprises a dielectric layer.

Any dielectric material may be used in the dielectric layer, with yttria and barium titanate being preferred e.g. the barium titanate paste LUXPRINT™ type 7153E high K dielectric insulator supplied by DuPont and the barium titanate paste ELECTRODAG™ EL-040 supplied by Acheson. A positive ion exchanger may be incorporated into the dielectric layer to capture any ions dissolving escaping from the phosphor of the light-emitting layer. The amount of ion exchanger in the dielectric layer has to be optimized so that it has a maximum effectiveness in reducing black spots while not reducing the initial brightness level. It is therefore preferred to add 0.5 to 50 parts by weight of ion exchanger to 100 parts by weight of the total amount of resin and dielectric material in the dielectric layer. The ion exchanger may be organic or inorganic.

Suitable inorganic ion exchangers are hydrated antimony pentoxide powder, titanium phosphate, salts of phosphoric acid and silicic acid and zeolite.

Aspects of the present invention are also realized by a light emitting diode comprising the conductive layer, according to the present invention, or a second light emitting diode produced according to the process, according to the present invention.

According to a first embodiment of the light-emitting diodes, according to the present invention, the light-emitting diode further comprises a electroluminescent layer comprising a low molecular eight electroluminescent compound.

According to a second embodiment of the light-emitting diodes, according to the present invention, the light-emitting diode further comprises a electroluminescent layer comprising a polymeric electroluminescent compound.

According to a third embodiment of the light-emitting diodes, according to the present invention, the light-emitting diode further comprises electroluminescent quantum dots.

Photovoltaic Devices

Aspects of the present invention are also realized by a photovoltaic device comprising the conductive layer, according to the present invention, or a second photovoltaic device produced according to the process, according to the present invention.

Aspects of the present invention are also realized by a solar cell comprising the conductive layer, according to the present invention, or a second solar cell produced according to the process, according to the present invention.

According to a first embodiment of the photovoltaic devices, according to the present invention, the photovoltaic device further comprises at least one photovoltaic layer. The photovoltaic layer may be organic layer, a hybrid inorganic and organic layer or an inorganic layer.

Photovoltaic devices incorporating the conductive layer, according to the present invention, can be of two types: the regenerative type which converts light into electrical power leaving no net chemical change behind in which current-carrying electrons are transported to the anode and the external circuit and the holes are transported to the cathode where they are oxidized by the electrons from the external circuit and the photosynthetic type in which there are two redox systems one reacting with the holes at the surface of the semiconductor electrode and one reacting with the electrons entering the counter-electrode, for example, water is oxidized to oxygen at the semiconductor photoanode and reduced to hydrogen at the cathode. In the case of the regenerative type of photovoltaic cell, as exemplified by the Graetzel cell, the electron transporting medium may be a nano-porous metal oxide semiconductor with a band-gap of greater than 2.9 eV, such as titanium dioxide, niobium(V) oxide, tantalum(V) oxide and zinc oxide, the hole transporting medium may be a liquid electrolyte supporting a redox reaction, a gel electrolyte supporting a redox reaction, an organic hole transporting material, which may be a low molecular weight material such as 2,2',7,7'-tetrakis(N,N-di-p-methoxyphenyl-amine)9,9'-spirobifluorene (OMeTAD) or triphenylamine compounds or a polymer such as PPV-derivatives, poly(N-vinylcarbazole) etc., or inorganic semiconductors such as CuI, CuSCN etc. The charge transporting process can be ionic as in the case of a liquid electrolyte or gel electrolyte or electronic as in the case of organic or inorganic hole transporting materials.

Such regenerative photovoltaic devices can have a variety of internal structures in conformity with the end use. Conceivable forms are roughly divided into two types: structures which receive light from both sides and those which receive light from one side. An example of the former is a structure made up of a transparently conductive layer e.g. an ITO-layer or a PEDOT/PSS-containing layer and a transparent counter electrode electrically conductive layer e.g. an ITO-layer or a PEDOT/PSS-containing layer having interposed therebetween a photosensitive layer and a charge transporting layer. Such devices preferably have their sides sealed with a polymer, an adhesive or other means to prevent deterioration or volatilization of the inside substances. The external circuit connected to the electrically-conductive substrate and the counter electrode via the respective leads is well-known.

Alternatively the spectrally sensitized nano-porous metal oxide, according to the present invention, can be incorporated in hybrid photovoltaic compositions such as described in 1991 by Graetzel et al. in Nature, volume 353, pages 737–740, in 1998 by U. Bach et al. [see Nature, volume 395, pages 583–585 (1998)] and in 2002 by W. U. Huynh et al. [see Science, volume 295, pages 2425–2427 (2002)]. In all these cases, at least one of the components (light absorber, electron transporter or hole transporter) is inorganic (e.g. nano-$TiO_2$ as electron transporter, CdSe as light absorber and electron transporter) and at least one of the components is organic (e.g. triphenylamine as hole transporter or poly (3-hexylthiophene) as hole transporter).

Transistors

Aspects of the present invention are also realized by a transistor comprising the conductive layer, according to the present invention, or a second transistor produced according to the process, according to the present invention.

According to a first embodiment of the transistors, according to the present invention, the transistor further comprises a layer with one or more of the electron transporting or hole transporting components described above, but within such a configuration that it can be used as a transistor. The semiconductor can be n-type, p-type or both (ambipolar transistor) and can be either organic or inorganic.

INDUSTRIAL APPLICATION

A conductive layer, according to the present invention, can be used in a wide range of electronic devices such as photovoltaic devices, solar cells, batteries, capacitors, light emitting diodes, organic and inorganic electroluminescent devices, smart windows, electrochromic devices, sensors for organic and bio-organic materials and field effect transistors [see also chapter 10 of the Handbook of Oligo- and Polythiophenes, Edited by D. Fichou, Wiley-VCH, Weinheim (1999)].

The invention is illustrated hereinafter by way of INVENTION and COMPARATIVE EXAMPLES. The percentages and ratios given in these examples are by weight unless otherwise indicated.

Ingredients Used in the Comparative Experiments of Example 2:

| | Structural formula | |
|---|---|---|
| STAB01 | (1-phenyl ring with tetrazole-thione structure) | 1-phenyl-5-mercapto-tetrazole |
| STAB02 | | sodium tartrate |
| STAB03 | | thiourea |
| STAB04 | $Na_2S$ | sodium sulphide |
| STAB05 | (triazolopyrimidinol structure with OH) | 5-methyl-s-triazolo[1,5-a]pyrimidin-7-ol |
| STAB06 | $H_{15}C_7$—(oxadiazole ring)—SH | |

-continued

| Structural formula |
|---|
| STAB07 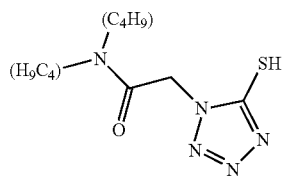 |
| STAB08 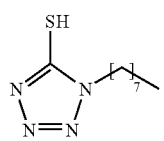 |
| STAB09 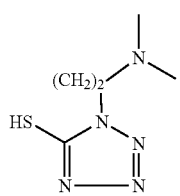 |

EXAMPLE 1 (COMPARATIVE)

Conductive Ag-pattern Made by Diffusion Transfer Reaction with Conductive PEDOT/PSS on Top Preparation of Material A:

The preparation of the physical development nuclei (PdS) is described in the example of EP-A 0769 723. From this example solutions A1, B1 and C1 were used to prepare the nuclei. To 1000 ml of this PdS dispersion 10 g of a 10 g/L water solution of Aerosol OT from American Cyanamid and 5 g of a 50 g/L solution of perfluorcaprylamide-polyglycol were added. This dispersion was then is coated to a wet layer thickness of 13.5 μm on a poly(ethylene terephthalate) support with a 4 μm thick gelatine subbing layer and then dried for 60 minutes at 25° C. This is material A.

Preparation of the PEDOT/PSS Dispersion:

EP-A 686662 and U.S. Pat. No. 5,766,515 disclose in the example the preparation of a 1.2% PEDOT/PSS dispersion in water. 15 ml of a 2% solution of ZONYL™ FSO100 in water, 1.25 g of Z6040, a silane from DOW CORNING and 25 g of diethylene glycol were added to 106 g of this dispersion to give the PEDOT/PSS dispersion used in the following EXAMPLES.

Preparation of Material B:

The above-described PEDOT/PSS dispersion was used to coat Material A to a wet thickness of 40 μm and was then dried for 15 minutes at 100° C., thereby producing material C.

Preparation of the Transfer Emulsion Layer:

The preparation of the silver chlorobromide emulsion and the preparation of the transfer emulsion layer was as disclosed in EP-A 769 723 except that the coverage of silver halide applied was equivalent to 1.25 g/m of AgNO₃ instead of 2 g/m thereof.

Exposure and Development of Materials A and B:

The transfer emulsion layer was exposed image-wise as shown in FIG. 1 and processed in contact with the receiver (Material A and material B) at 25° C. for 10 s with a AGFA-GEVAERT™ CP297 developer solution.

Preparation of the Double Layer Electrode Configuration:

Processed material A was coated with the above-described PEDOT/PSS-dispersion to a wet-layer thickness of 50 μm and then dried for 20 minutes at 120° C. The surface resistivity of the PEDOT/PSS layer was about 500 Ω/square in the non-exposed areas of material A. Material C was thereby prepared.

Evaluation of Materials B and C:

The surface resistance measurements were carried out as follows: the layer electrode configurations were cut into strips 3.5 cm in width to ensure perfect positioning of the electrode material; parallel copper electrodes each 35 mm long, 3 mm wide and 35 mm apart, capable of forming line contacts and mounted on a TEFLON™ insulator were brought into contact with the outermost conductive layer of the strip giving a contacting area of 3.5×3.5 cm², a constant contact force being ensured by placing a 4 kg weight on the TEFLON™ mounting; and the surface resistance was then directly measured using a Fluke-77 III Multimeter.

The optical density of the conductive layers was determined in transmission using a MacBeth™ TD924 densitometer with a visible filter for conductive layers without photographic treatment, in pattern type (d) in which no silver was developed and in pattern (a) in which silver was developed over the whole 3 cm×3 cm area without deducting the density of the support. The surface resistances and optical densities (complete material) after exposure and development according to the patterns shown in FIG. 1 are given in Table 1.

TABLE 1

| Control materials | Description | Pattern used from FIG. 1 type | Pattern used from FIG. 1 description | transmission O.D. | Surface resistance [Ω/square] |
|---|---|---|---|---|---|
| B | Without any photographic treatment | — | — | 0.09 | 500 |
| B | After transfer reaction | a | Solid area | 2.30 | 5.2 |
| B | After transfer reaction | b | 1 mm lines, 10 mm spacing | 0.33* | 37 |
| B | After transfer reaction | c | 150 μm lines, 5 mm spacing | 0.19* | 165 |
| B | After transfer reaction | d | No Ag developed | 0.07 | 800 |
| C | Without any photographic treatment | — | — | 0.10 | 650 |
| C | After transfer reaction | a | Solid area | 2.50 | 2.3 |
| C | After transfer reaction | b | 1 mm lines, 10 mm spacing | 0.35* | 18 |
| C | After transfer reaction | c | 150 μm lines, 5 mm spacing | 0.20* | 120 |
| C | After transfer reaction | d | No Ag developed | 0.09 | 750 |

*calculated values

EXAMPLE 2 (INVENTION)

Preparation of the Palladium Sulphide Dispersion:

The preparation of the physical development nuclei (PdS) is described in the example of EP-A 0769 723. From this example solutions A1, B1 and C1 were used to prepare the nuclei.

Preparation of Material D:

100 g of the above-described PEDOT/PSS dispersion was mixed with 3.35 g of the PdS-dispersion. To this mixture, 1.25 g of a 10 g/L water solution of AEROSOL™ OT (American Cyanamid), 0.625 g of a 50 g/l solution of perfluorcaprylamidpolyglycol and 61.9 ml of water were added to give the coating dispersion. This dispersion was coated on a support consisting of a poly(ethylene terephthalate) film and a 4 μm thick gelatin subbing layer to a wet-layer thickness of 50 μm with a doctor blade and then dried for 15 minutes at 100° C. to produce Material D.

Preparation of the Transfer Emulsion Layer:

The preparation of the silver chlorobromide emulsion and the preparation of the transfer emulsion layer was as disclosed in EP-A 769 723 except that the coverage of silver halide applied was equivalent to 1.25 g/m of AgNO₃ instead of 2 g/m thereof.

Exposure and Development

The transfer emulsion layer was exposed image-wise as shown in FIG. 1 and processed in contact with the receiver at 25° C. for 10 s with an AGFA-GEVAERT™ CP297 developer solution.

Evaluation

Surface resistance and optical density measurements were carried out as described above for COMPARATIVE EXAMPLE 1 and the results are given in Table 2.

TABLE 2

| Invention material | Description | Pattern used in FIG. 1 type | Pattern used in FIG. 1 description | transmission O.D. | Surface resistance [Ω/square] |
|---|---|---|---|---|---|
| D | Without any photographic treatment | — | — | 0.11 | 340 |
| D | After transfer reaction | a | Solid area | 2.04 | 7.2 |
| D | After transfer reaction | b | 1 mm lines, 10 mm spacing | 0.28* | 40 |
| D | After transfer reaction | c | 150 μm lines, 5 mm spacing | 0.16* | 140 |
| D | After transfer reaction | d | No Ag deposit | 0.10 | 530 |

*calculated value

Comparing Tables 1 and 2, it is surprising that the surface resistances and optical densities determined with the single layer composite material of the present invention of Material D are fully comparable with the two layer configuration of Material B with the same components produced using the same techniques and exhibited higher visible light transmission than the two layer configuration of Material C in which the PEDOT/PSS-layer was coated on a non-continuous developed silver layer.

The embedding of the developed silver in the PEDOT/PSS-layer results is a greater flatness of the outermost surface of the single layer compared with the two layer configuration.

From Table 2 it can be concluded that (1) it is possible to expose the PEDOT/PSS layer to the AGFA-GEVAERT™ CP297 developer with minor loss in surface conductivity without affecting the optical transparency and (2) the silver-lines increase the "apparent" surface conductivity significantly as is the case with two layer configurations with the same components indicating that the embedded developed silver forms of itself a conductive entity.

EXAMPLE 3 (INVENTION)

Conceptual experiments were carried out with a recorder film with a gelatine to silver ratio of 0.014. Exposed areas of 1×3 cm$^2$ as electrodes with a separation of 40 µm gave conducting silver patterns upon processing by conventional graphic processing. The resulting electrode pattern had a surface resistance of 50 to 100 ohm/square.

These electrodes were conditioned for 3 days at 35° C. and a relative humidity of 80%. The aqueous solutions used for treating the electrodes prior to applying a potential of 100 V between neighbouring electrodes are listed in Table 3.

TABLE 3

| Solution nr. | Solution active ingredient | conc. (%) | solvent |
|---|---|---|---|
| 1 | STAB01 (1-phenyl-5-mercapto-tetrazole) | 1.0 | water* |
| 2 | STAB01 | 0.1 | water* |
| 3 | STAB01 + Antarox ™ CO 630# | 1.0 + 0.5 | water |
| 4 | STAB01 + Antarox ™ CO 630# | 0.1 + 0.5 | water |
| 5 | STAB02 (sodium tartrate) | 10 | water |
| 6 | STAB02 (sodium tartrate) | 1 | water |
| 7 | STAB03 (thiourea) | 10 | water |
| 8 | STAB03 (thiourea) | 1 | water |
| 9 | STAB04 (sodium sulphide) | 10 | water |
| 10 | STAB04 (sodium sulphide) | 1 | water |
| 11 | STAB05 (5-methyl-s-triazolo[1,5-a]pyrimidin-7-ol) | 4.25 | water |
| 12 | STAB05 | 0.425 | water |
| 13 | STAB05 | $1.7 \times 10^{-2}$ | water |
| 14 | STAB05 | $1.7 \times 10^{-4}$ | water |
| 15 | STAB05 | $1.7 \times 10^{-5}$ | water |
| 16 | STAB05 | $1.7 \times 10^{-6}$ | water |
| 17 | STAB06 | 0.5 | water |
| 18 | STAB06 | 0.05 | water |
| 19 | STAB06 | 0.005 | water |
| 20 | STAB07 | 0.5 | water |
| 21 | STAB07 | 0.05 | water |
| 22 | STAB07 | 0.005 | water |
| 23 | STAB08 | 0.5 | water |
| 24 | STAB08 | 0.05 | water |
| 25 | STAB08 | 0.005 | water |
| 26 | STAB09 | 0.5 | water |
| 27 | STAB09 | 0.05 | water |
| 28 | STAB09 | 0.005 | water |
| 29 | PMT01 | 0.1 | ethanol |
| 30 | PMT01 | 0.004 | ethanol |
| 31 | PMT01 | $4 \times 10^{-5}$ | ethanol |
| 32 | PMT01 | $4 \times 10^{-6}$ | ethanol |

TABLE 3-continued

| Solution nr. | Solution active ingredient | conc. (%) | solvent |
|---|---|---|---|
| 33 | PMT02 | 0.5 | water |
| 34 | PMT02 | 0.05 | water |
| 35 | PMT02 | 0.005 | water |
| 36 | PMT03 | 0.5 | water |
| 37 | PMT03 | 0.05 | water |
| 38 | PMT03 | 0.005 | water |
| 39 | PMT04 | 0.5 | ethanol |
| 40 | PMT04 | 0.05 | ethanol |
| 41 | PMT04 | 0.005 | ethanol |
| 42 | PMT05 | 0.5 | water |
| 43 | PMT05 | 0.05 | water |
| 44 | PMT05 | 0.005 | water |
| 45 | PMT06 | 0.05 | water |
| 46 | PMT06 | 0.005 | water |
| 47 | PMT07 | 0.05 | water |
| 48 | PMT07 | 0.005 | water |
| 49 | PMT08 | 0.5 | water |
| 50 | PMT08 | 0.05 | water |
| 51 | PMT08 | 0.005 | water |
| 52 | PMT09 | 0.5 | water |
| 53 | PMT09 | 0.05 | water |
| 54 | PMT09 | 0.005 | water |
| 55 | PMT10 | 0.5 | water |
| 56 | PMT10 | 0.05 | water |
| 57 | PMT11 | 0.05 | water |
| 58 | PMT11 | 0.005 | water |
| 59 | PMT12 | 0.05 | water |
| 60 | PMT12 | 0.005 | water |
| 61 | PMT13 | 0.05 | water |
| 62 | PMT13 | 0.005 | water |
| 63 | PMT14 | 0.05 | water |
| 64 | PMT14 | 0.005 | water | a nonyl-phenyl-oxy-polyethyleneglycol (EO 9.5), from GAF

After treatment of the electrodes by dipping in the solution for 1 minute at 25° C., a potential of 100 V was applied between neighbouring electrodes for 20 minutes. The result was viewed under a microscope and recorded photographically. The gap between the electrodes without pretreatment and before applying a potential was determined to be 43.0±0.7 µm. Tables 4 and 5 record the final gap width and general observations concerning silver dendrite formation after particular pretreatments and the subsequent application of a potential of 100 V for 20 minutes for the comparative experiments with STAB01 to STAB09 and for the invention experiments with PMT01 to PMT14 respectively.

TABLE 4

| Comparative experiment nr. | solution nr. | result of applying 100 V for 20 min. between electrodes | |
|---|---|---|---|
| | | final width of gap [µm] | observations |
| 1# | none | 25.8 ± 1.0 | front formation |
| 2* | none | 28.3 ± 1.0 | front formation |
| 3* | none | 43.1 ± 1.2 | dendrites, but no front formation |
| 4 | 1 | 23.6 ± 1.8 | front formation |
| 5 | 2 | 21.5 ± 2.5 | front formation |
| 6 | 3 | 25.5 ± 2.9 | front formation |
| 7 | 4 | 41.8 ± 0.7 | dendrite formation |
| 8 | 5 | 35.5 ± 1.3 | front formation but loss of electrode contact |
| 9 | 6 | 33.6 ± 1.7 | front formation |
| 10 | 7 | 27.8 ± 1.9 | front formation |
| 11 | 8 | 26.2 ± 2.9 | front formation |

TABLE 4-continued

| Comparative experiment nr. | solution nr. | result of applying 100 V for 20 min. between electrodes | |
|---|---|---|---|
| | | final width of gap [μm] | observations |
| 12 | 9 | 22.1 ± 4.1 | front formation but loss of electrode contact |
| 13 | 10 | 27.8 ± 2.7 | front formation |
| 14 | 11 | 30.4 ± 1.7 | front formation |
| 15 | 12 | 26.0 ± 1.2 | front formation |
| 16 | 13 | 21.8 ± 2.0 | zones with front formation/ zones with dendrites but no front formation |
| 17 | 14 | 23.5 ± 3.1 43.8 ± 0.7 | zones with front formation/ zones with dendrites but no front formation |
| 18 | 15 | 25.7 ± 2.1 42.4 ± 1.0 | zones with front formation/ zones with dendrites but no front formation |
| 19 | 16 | 22.6 ± 2.3 | zones with front formation/ zones with dendrites but no front formation |
| 20 | 17 | 28.6 ± 0.6 | front formation |
| 21 | 18 | 26.7 ± 0.6 | front formation |
| 22 | 19 | 43.2 ± 0.6 | dendrites, but no front formation |
| 23 | 20 | 23.4 ± 0.9 | front formation |
| 24 | 21 | 24.9 ± 1.1 | front formation |
| 25 | 22 | 24.6 ± 0.6 | front formation |
| 26 | 23 | 32.2 ± 2.3 | front formation |
| 27 | 24 | 43.3 ± 0.6 | dendrites, but no front formation |
| 28 | 25 | 42.4 ± 1.8 | dendrites, but no front formation |
| 29 | 26 | 42.7 ± 1.7 | dendrites, but no front formation |
| 30 | 27 | 43.1 ± 1.0 | occasional dendrites |
| 31 | 28 | 43.0 ± 0.4 | occasional dendrites | neither conditioning nor solution pretreatment prior to application of 100 V DC
*no solution pretreatment between conditioning and application of 100 V DC

TABLE 5

| Invention experiment nr. | solution nr. | result of applying 100 V for 20 min. between electrodes | |
|---|---|---|---|
| | | final width of gap [μm] | observations |
| 1 | 29 | 41.9 ± 0.7 | almost no dendrite formation |
| 2 | 30 | 42.4 ± 0.7 | almost no dendrite formation |
| 3 | 31 | 41.5 ± 0.4 | almost no dendrite formation |
| 4 | 32 | 41.4 ± 1.1 | occasional dendrites |
| 5 | 33 | 29.8 ± 0.4 | front formation |
| 6 | 34 | 29.4 ± 1.4 | front formation |
| 7 | 35 | 43.1 ± 0.3 | dendrites, but no front formation |
| 8 | 36 | 42.9 ± 0.4 | occasional dendrites |
| 9 | 37 | 42.6 ± 0.7 | occasional dendrites |
| 10 | 38 | 43.3 ± 0.75 | dendrites, but no front formation |
| 11 | 39 | 42.4 ± 0.8 | almost no dendrite formation |
| 12 | 40 | 43.4 ± 0.7 | occasional dendrites |
| 13 | 41 | 42.4 ± 1.0 | dendrites, but no front formation |
| 14 | 42 | 43.9 ± 0.8 | dendrites, but no front formation |
| 15 | 43 | 43.8 ± 0.6 | almost no dendrite formation |
| 16 | 44 | 44.2 ± 0.4 | almost no dendrite formation |
| 17 | 45 | 42.9 ± 0.7 | dendrites, but no front formation |
| 18 | 46 | 43.4 ± 0.7 | almost no dendrite formation |
| 19 | 47 | 43.5 ± 1.0 | occasional dendrites |
| 20 | 48 | 43.2 ± 0.9 | occasional dendrites |
| 21 | 49 | 25.4 ± 2.3 | front formation |
| 22 | 50 | 43.4 ± 0.8 | occasional dendrites |
| 23 | 51 | 43.7 ± 0.4 | almost no dendrite formation |
| 24 | 52 | 43.3 ± 0.7 | dendrites, but no front formation |
| 25 | 53 | 42.0 ± 0.8 | occasional dendrites |
| 26 | 54 | 43.9 ± 0.5 | almost no dendrite formation |
| 27 | 55 | 24.1 ± 4.0 | front formation |
| 28 | 56 | 42.9 ± 0.9 | dendrites, but no front formation |
| 29 | 57 | 25.6 ± 3.3 | front formation |
| 30 | 58 | 43.0 ± 0.5 | occasional dendrites |
| 31 | 59 | 23.4 ± 3.0 | front formation |
| 32 | 60 | 42.8 ± 0.4 | almost no dendrite formation |
| 33 | 61 | 42.2 ± 0.6 | occasional dendrites |
| 34 | 62 | 41.9 ± 1.2 | occasional dendrites |
| 35 | 63 | 26.1 ± 2.1 | front formation |
| 36 | 64 | 41.6 ± 1.1 | occasional dendrites |

These results show migration of silver ions upon conditioning for 3 days at 35° C. and 80% relative humidity and subsequent application of a potential of 100 V DC for 20 minutes in the absence of pretreatment (comparative experiments 2 and 3). A comparison of the results with comparative experiments 1 and 2 show that conditioning clearly promoted silver dendrite growth as observed in actual devices.

Pretreatment with an aqueous solution of sodium tartrate (STAB02) provided limited restraint as shown by the reduced growth of the silver dendrite front. Pretreatment with high concentrations of sodium sulphide (STAB04) appeared to detach the silver dendrite front from the electrode. Low concentrations of 5-methyl-s-triazolo[1,5-a]pyrimidin-7-ol (STAB05) also restrained silver dendrite growth as evidenced by the break up of the silver dendrite front into clusters of silver dendrites although this was limited to particular zones.

All the 5-mercapto-tetrazoles investigated, with the notable exception of unsubstituted 1-phenyl-5-mercapto-tetrazole [STAB01], also exerted at least a limited restraint on the silver dendrite-formation process as could be seen by at least the appearance of a broken front formed by clusters of silver-dendrites. 1-phenyl-5-mercapto-tetrazole itself exhibited this behaviour in the presence of the surfactant Antarox™ CO 630, a non-ionic surfactant. However, substantial restraint was only observed with 1-phenyl-mercaptotetrazole compounds with the phenyl group substituted with at least one electron accepting group such as halide, acylamino or amido groups as shown by the compounds PMT01 to PMT14. Almost complete restraint was observed upon pretreatment with solutions 29, 30, 31, 39, 43, 44, 46, 51, 54 and 60 i.e. with PMT1, PMT05, PMT06, PMT08, PMT09 and PMT12 almost complete restraint was observed at concentrations of 1-phenyl-5-mercapto-tetrazole with phenyl groups substituted with electron accepting groups of 0.005%: or lower.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

Having described in detail preferred embodiments of the current invention, it will now be apparent to those skilled in the art that numerous modifications can be made therein without departing from the scope of the invention as defined in the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practised otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

I claim:

1. A substantially transparent conductive layer on a support, said layer comprising an intrinsically conductive polymer and a conductive metal non-uniformly distributed therein and forming of itself a conductive entity.

2. A substantially transparent conductive layer on a support, said layer comprising an intrinsically conductive polymer and a conductive metal non-uniformly distributed therein and forming of itself a conductive entity, wherein said intrinsically conductive polymer contains structural units represented by formula (I):

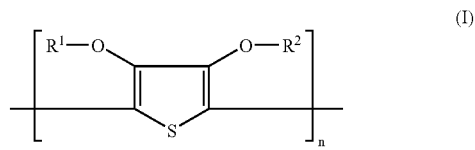

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

3. The conductive layer according to claim 2, wherein said conductive metal is silver.

4. The conductive layer according to claim 3, wherein said conductive layer further contains a 1-phenyl-5-mercato-tetrazole compound in which the phenyl group is substituted with one or more electron accepting groups.

5. A process for preparing a substantially transparent conductive layer on a support, said layer comprising an intrinsically conductive polymer and a conductive metal non-uniformly distributed therein and forming of itself a conductive entity, comprising the step of: preparing said non-uniformly distributed conductive metal by a photographic process.

6. A process for preparing a substantially transparent conductive layer on a support, said layer comprising an intrinsically conductive polymer and a conductive metal non-uniformly distributed therein and forming of itself a conductive entity, comprising the step of: preparing said non-uniformly distributed conductive metal by a photographic process, wherein said photographic process comprises the steps of: coating the support with a layer containing said intrinsically conductive polymer and a nucleation agent; and producing a non-continuous silver layer in said nucleation layer using silver salt diffusion transfer.

7. The process according to claim 6, wherein said nucleation agent is palladium sulphide.

8. The process according to claim 6, wherein said intrinsically conductive polymer contains structural units represented by formula (I):

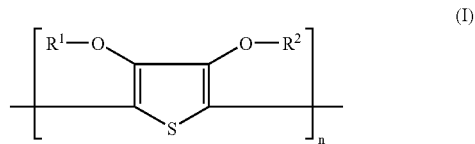

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

9. A light emitting diode comprising a substantially transparent conductive layer on a support, said layer comprising an intrinsically conductive polymer and a conductive metal non-uniformly distributed therein and forming of itself a conductive entity.

10. The light emitting diode according to claim 9, wherein said intrinsically conductive polymer contains structural units represented by formula (I):

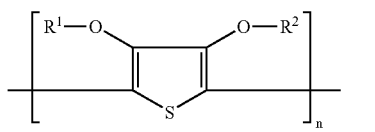

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group an optionally $C_{1-12}$ alkyl- or phenyl-substituted ethylene group, a 1,3-propylene group or a 1,2-cyclohexylene group.

11. The light emitting diode according to claim 9, wherein said conductive metal is silver.

12. The light emitting diode according to claim 11, wherein said conductive layer further contains a 1-phenyl-5-mercato-tetrazole compound in which the phenyl group is substituted with one or more electron accepting groups.

13. A light light emitting diode prepared by a process for preparing a substantially transparent conductive layer on a support, said layer comprising an intrinsically conductive polymer and a conductive metal non-uniformly distributed therein and forming of itself a conductive entity, said process comprising the step of: preparing said non-uniformly distributed conductive metal by a photographic process.

14. The light emitting diode according to claim 13, wherein said photographic process comprises the steps of: coating the support with a layer containing said intrinsically conductive polymer and a nucleation agent; producing a non-continuous silver layer in said nucleation layer using silver salt diffusion transfer.

15. The light emitting diode according to claim 14, wherein said nucleation agent is palladium sulphide.

16. The light emitting diode according to claim 13, wherein said photographic process comprises the steps of: coating said support with a layer containing an intrinsically conductive polymer, silver halide and gelatin with a weight ratio of gelatin to silver halide in the range of 0.05 to 0.3, image-wise exposing said layer, and developing said exposed layer to produce said non-uniformly distributed silver.

17. The light emitting diode according to claim 13, wherein said intrinsically conductive polymer contains structural units represented by formula (I):

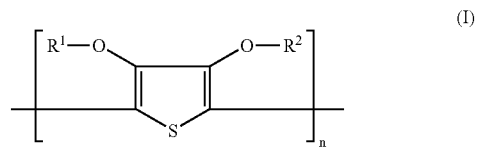

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

18. A photovoltaic device comprising a substantially transparent conductive layer on a support, said layer comprising an intrinsically conductive polymer and a conductive metal non-uniformly distributed therein and forming of itself a conductive entity.

19. The photovoltaic device according to claim 18, wherein said intrinsically conductive polymer contains structural units represented by formula (I):

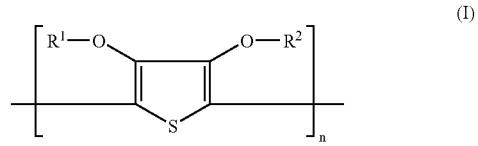

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- phenyl-substituted ethylene group, a 1,3-propylene group or a 1,2-cyclohexylene group.

20. The photovoltaic device according to claim 18, wherein said conductive metal is silver.

21. The photovoltaic device according to claim 20, wherein said conductive layer further contains a 1-phenyl-5-mercato-tetrazole compound in which the phenyl group is substituted with one or more electron accepting groups.

22. A photovoltaic device prepared by a process for preparing a substantially transparent conductive layer on a support, said layer comprising an intrinsically conductive polymer and a conductive metal non-uniformly distributed therein and forming of itself a conductive entity, comprising the step of: preparing said non-uniformly distributed conductive metal by a photographic process.

23. The photovoltaic device according to claim 22, wherein said photographic process comprises the steps of: coating the support with a layer containing said intrinsically conductive polymer and a nucleation agent; producing a non-continuous silver layer in said nucleation layer using silver salt diffusion transfer.

24. The photovoltaic device according to claim 23, wherein said nucleation agent is palladium sulphide.

25. The photovoltaic device according to claim 22, wherein said photographic process comprises the steps of: coating said support with a layer containing an intrinsically conductive polymer, silver halide and gelatin with a weight ratio of gelatin to silver halide in the range of 0.05 to 0.3, image-wise exposing said layer, and developing said exposed layer to produce said non-uniformly distributed silver.

26. The photovoltaic device according to claim 22, wherein said intrinsically conductive polymer contains structural units represented by formula (I):

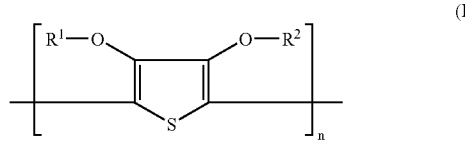

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

27. A transistor comprising a substantially transparent conductive layer on a support, said layer comprising an intrinsically conductive polymer and a conductive metal non-uniformly distributed therein and forming of itself a conductive entity.

28. The transistor according to claim 27, wherein said intrinsically conductive polymer contains structural units represented by formula (I):

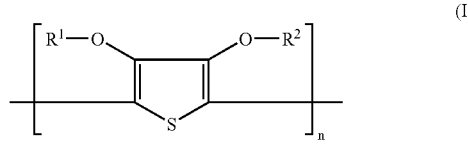

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

29. The transistor according to claim 27, wherein said conductive metal is silver.

30. The transistor according to claim 29, wherein said conductive layer further contains a 1-phenyl-5-mercato-tetrazole compound in which the phenyl group is substituted with one or more electron accepting groups.

31. A transistor transistor prepared by a process for preparing a substantially transparent conductive layer on a support, said layer comprising an intrinsically conductive polymer and a conductive metal non-uniformly distributed therein and forming of itself a conductive entity, comprising the step of: preparing said non-uniformly distributed conductive metal by a photographic process.

32. The transistor according to claim 31, wherein said photographic process comprises the steps of: coating the support with a layer containing said intrinsically conductive polymer and a nucleation agent; producing a non-continuous silver layer in said nucleation layer using silver salt diffusion transfer.

33. The transistor according to claim 32, wherein said nucleation agent is palladium sulphide.

34. The transistor according to claim 31, wherein said photographic process comprises the steps of: coating said support with a layer containing an intrinsically conductive polymer, silver halide and gelatin with a weight ratio of gelatin to silver halide in the range of 0.05 to 0.3, image-wise exposing said layer, and developing said exposed layer to produce said non-uniformly distributed silver.

35. The transistor according to claim 31, wherein said intrinsically conductive polymer contains structural units represented by formula (I):

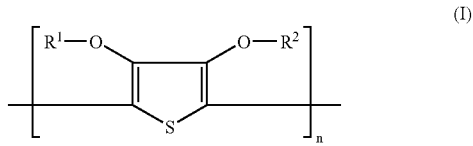

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

36. An electroluminescent device comprising a substantially transparent conductive layer on a support, said layer comprising an intrinsically conductive polymer and a conductive metal non-uniformly distributed therein end forming of itself a conductive entity.

37. The electroluminescent device according to claim 36, wherein said intrinsically conductive polymer contains structural units represented by formula (I):

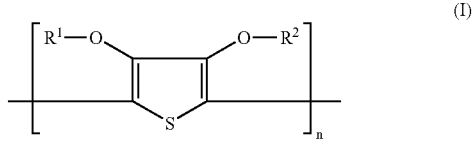

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

38. The electroluminescent device according to claim 36, wherein said conductive metal is silver.

39. The electroluminescent device according to claim 38, wherein said conductive layer further contains a 1-phenyl-5-mercato-tetrazole compound in which the phenyl group is substituted with one or more electron accepting groups.

40. An electroluminescent device prepared by a process for preparing a substantially transparent conductive layer on a support, said layer comprising an intrinsically conductive polymer and a conductive metal non-uniformly distributed therein and forming of itself a conductive entity, comprising the step of: preparing said non-uniformly distributed conductive metal by a photographic process.

41. The electroluminescent device according to claim 40, wherein said photographic process comprises the steps of: coating the support with a layer containing said intrinsically conductive polymer and a nucleation agent; producing a non-continuous silver layer in said nucleation layer using silver salt diffusion transfer.

42. The electroluminescent device according to claim 41, wherein said nucleation agent is palladium sulphide.

43. The electroluminescent device according to claim 40, wherein said photographic process comprises the steps of: coating said support with a layer containing an intrinsically conductive polymer, silver halide and gelatin with a weight ratio of gelatin to silver halide in the range of 0.05 to 0.3, image-wise exposing said layer, and developing said exposed layer to produce said non-uniformly distributed silver.

44. The electroluminescent device according to claim 40, wherein said intrinsically conductive polymer contains structural units represented by formula (I):

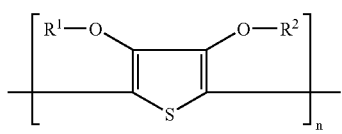

(I)

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

45. A substantially transparent conductive layer on a support, said layer comprising an intrinsically conductive polymer and a conductive metal non-uniformly distributed therein and forming of itself a conductive entity, wherein said conductive metal is silver and said conductive layer further contains a 1-phenyl-5-mercato-tetrazole compound in which the phenyl group is substituted with one or more electron accepting groups.

46. A process for preparing a substantially transparent conductive layer on a support, said layer comprising an intrinsically conductive polymer and a conductive metal non-uniformly distributed therein and forming of itself a conductive entity, comprising the step of: preparing said non-uniformly distributed conductive metal by a photographic process, wherein said photographic process comprises the steps of: coating said support with a layer containing an intrinsically conductive polymer, silver halide and gelatin wit a weight ratio of gelatin to silver halide in the range of 0.05 to 0.3, image-wise exposing said layer, and developing said exposed layer to produce said non-uniformly distributed silver.

47. The process according to claim 46, wherein said intrinsically conductive polymer contains structural units represented by formula (I):

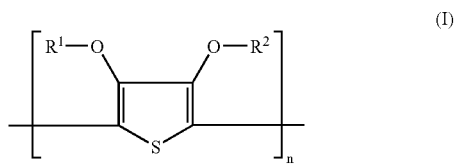

(I)

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

48. A process for preparing a substantially transparent conductive layer on a support, said layer comprising an intrinsically conductive polymer and a conductive metal non-uniformly distributed therein and forming of itself a conductive entity, comprising the step of: preparing said non-uniformly distributed conductive metal by a photographic process, wherein said intrinsically conductive polymer contains structural units represented by formula (I):

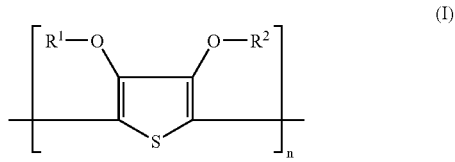

(I)

wherein n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, art optionally alkyl-substituted methylene group, an optionally $C_{1-12}$ alkyl- or phenyl-substituted ethylene group, a 1,3-propylene group or a 1,2-cyclohexylene group.

49. The process according to claim 48, wherein said photographic process comprises the steps of: coating said support with a layer containing an intrinsically conductive polymer, silver halide and gelatin with a weight ratio of gelatin to silver halide in the range of 0.05 to 0.3, image-wise exposing said layer, and developing said exposed layer to produce said non-uniformly distributed silver.

* * * * *